(12) United States Patent
Hyun

(10) Patent No.: US 7,507,595 B2
(45) Date of Patent: Mar. 24, 2009

(54) CMOS IMAGE SENSOR AND METHOD FOR FABRICATING THE SAME

(75) Inventor: Woo Seok Hyun, Chungcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/319,730

(22) Filed: Dec. 29, 2005

(65) Prior Publication Data

US 2006/0145212 A1   Jul. 6, 2006

(30) Foreign Application Priority Data

Dec. 30, 2004  (KR) .................. 10-2004-0116421
Dec. 30, 2004  (KR) .................. 10-2004-0116553

(51) Int. Cl.
    *H01L 21/00* (2006.01)
(52) U.S. Cl. .................. 438/48; 438/57; 257/291; 257/292
(58) Field of Classification Search .......... 257/292, 257/291, 293; 438/48, 57
    See application file for complete search history.

(56) References Cited

U.S. PATENT DOCUMENTS 5,567,976 A * 10/1996 Dierschke et al. ........... 257/443
6,387,828 B1 * 5/2002 Lane et al. ................. 438/795
2004/0195490 A1 10/2004 Sugiyama et al.
2005/0269606 A1 * 12/2005 Mouli ........................ 257/292
2006/0006436 A1 * 1/2006 Mouli ........................ 257/290

FOREIGN PATENT DOCUMENTS

CN  200410008533  9/2004
WO  WO 03/049190  6/2003

OTHER PUBLICATIONS

IEEE transaction on electron device vol. 51 No. 8 Aug. 2004: the effects of Deuterium Annealing on the Rreduction of Dark currents in the CMOS APS by Kwon et al. ( 4 pages ).*

* cited by examiner

*Primary Examiner*—David Vu
*Assistant Examiner*—Thinh T Nguyen
(74) *Attorney, Agent, or Firm*—McKenna Long & Aldridge LLP

(57) ABSTRACT

A CMOS image sensor and fabricating method can reduce leakage current of a photodiode reduced by configuring a triangular shape of a photodiode area to minimize an interface contacting the STI or performing deuterium annealing to remove dangling bonds from an interface contacting with oxide. The CMOS image sensor includes a semiconductor substrate, a device isolation layer on the semiconductor substrate, and a plurality of diodes, each having a shape minimizing an area of a boundary contacting with the device isolation layer.

6 Claims, 14 Drawing Sheets

(a) Peri Area (b) Active Area

Peri Area

Active Area

CMOS IMAGE SENSOR AND METHOD FOR FABRICATING THE SAME

CROSS REFERENCE TO RELATED APPLICATIONS

This application claims the benefit of the Korean Patent Application No. 10-2004-0116421, filed on Dec. 30, 2004, and Korean Patent Application No. 10-2004-0116553, filed on Dec. 30, 2004, which are both hereby incorporated by reference as if fully set forth herein.

BACKGROUND OF THE INVENTION

1. Field of the Invention

The present invention relates to an image sensor, and more particularly, to a CMOS image sensor and method for fabricating the same. Although the present invention is suitable for a wide scope of applications, it is particularly suitable for reducing leakage current of a photodiode in a manner of configuring a triangle shaped a photodiode area to minimize an interface contact with STI shallow trench isolation (STI) or annealing in presence of deuterium to remove dangling bonds from an interface contact with oxide.

2. Discussion of the Related Art

Generally, an image sensor is a semiconductor device that converts an optical image to an electric signal. Image sensors can be classified as a charge coupled device (CCD) using a metal-oxide-metal (MOS) capacitor and a complementary MOS (CMOS) image sensor using MOS transistors.

In a CCD image sensor, a plurality of MOS capacitors are arranged close to one another to transfer and store electric charge carriers. In a CMOS image sensor, a plurality of MOS transistors corresponding to the number of pixels are fabricated by according to CMOS technology using a control circuit and a signal processing circuit as peripheral circuits and a switching system that detects outputs step by step using the MOS transistors is utilized.

The CCD has a complicated drive system, consumes large amounts of power, a complicated fabricating process having too many masks, and is difficult to implement into one-chip due to the difficulty in implementing a signal processing circuit within a CCD chip.

The CMOS image sensor processes an image by providing a photodiode and MOS transistors within a unit pixel and detecting signals sequentially with a switching system. The CMOS image sensor adopts the CMOS fabrication technology and its fabrication process needs about 20 masks, as compared to the CCD process that needs at least 30~40 masks. Moreover, the CMOS image sensor enables one-chip implementation with a signal processing circuit.

A CMOS image sensor circuit according to a related art and a photodiode of the CMOS image sensor are explained in detail below.

FIG. 1 is a layout of a unit pixel of a CMOS image sensor having three transistors and one photodiode according to the related art.

A unit pixel of an image sensor has of a rectangular type photodiode 10 for receiving light to generate photocharges, a reset transistor 11 receiving an Rx signal via its gate electrode to reset the photocharges generated from the photodiode 10, a drive transistor 12 receiving a Dx signal via its gate electrode to play a role as a source follower buffer amplifier, and a select transistor 13 playing a role in address processes. A STI (shallow trench isolation) layer 14 is formed to isolate devices.

FIG. 2 is a cross-sectional diagram of the CMOS image sensor shown in FIG. 1, which is taken along a line II-II.

A lightly-doped P type epitaxial layer (not shown) is grown on a heavily-doped P type substrate 15. A lightly-doped N type photodiode 10 and a STI layer 14 are formed on the epitaxial layer. A gate oxide layer 17 and a gate electrode 18 of the reset transistor 11 are sequentially formed on the epitaxial layer. Spacers 19 are formed on both sidewalls of the gate electrode 18, respectively.

FIG. 3 is a layout of a unit pixel of a CMOS image sensor having four transistors and one photodiode according to a related art. 100131 A unit pixel of an image sensor has of a rectangular type photodiode 10 for receiving light to generate photocharges, a transfer transistor 21 receiving a Tx signal via its gate electrode to transfer the photocharges generated from the photodiode 10, a reset transistor 11 receiving an Rx signal via its gate electrode to reset the photocharges, a drive transistor 12 receiving a Dx signal via its gate electrode to play a role as a source follower buffer amplifier, and a select transistor 13 playing a role in addressing. A STI layer 14 is formed to isolate devices.

FIG. 4 is a cross-sectional diagram of the CMOS image sensor shown in FIG. 3, which is taken along a cutting line IV-IV.

A lightly-doped P type epitaxial layer (not shown) is grown on a heavily-doped P type substrate 15. A lightly-doped N type photodiode 10 and a STI layer 14 are formed on the epitaxial layer. A gate oxide layer 17 and a gate electrode 18 of the transfer transistor 21 are sequentially formed on the epitaxial layer. Spacers 19 are formed on both sidewalls of the gate electrode 18, respectively. A heavily-doped N type diffusion region 25 is formed on the epitaxial layer beside the gate electrode 18.

FIG. 5 and FIG. 6 are layouts of pixel arrays of the CMOS image sensors shown in FIG. 1 and FIG. 3, respectively.

Referring to FIG. 5 and FIG. 6, unit pixels are isolated from one another by the STI layer 14. In particular, the unit pixels, as shown in FIG. 5, in the same row share a gate electrode of a select transistor 13.

FIG. 7 is a diagram of a pixel array of a CMOS image sensor according to a related art.

Green and red pixels 27 and 28 are alternately arranged in a first row. Blue and green pixels 29 and 27 are alternately arranged in a second row.

In the related art CMOS image sensor, since the photodiode has a rectangular shape, the four sides of the photodiode 10 are brought into contact with the STI layer 14. Hence, defects existing at the interface 20 between the STI 14 and photodiode 10 increase leakage current of the photodiode 10.

Moreover, in the related CMOS image sensor, since the semiconductor substrate 15 is annealed in the presence of hydrogen (hydrogen annealing process) to stabilize the interface 20 between the STI layer 14 and the photodiode 10 and the other interface 22 between the semiconductor substrate 15 and the gate oxide layer 17, hot electrons attributed to hot electron injection destroy Si—H bonds to increase trap generation from the interfaces 20 and 22. As such, leakage current of the photodiode 10 is increased.

Moreover, since the STI layer 14 includes a trench formed by reactive ion etch (RIE), the characteristics of the interface 20 between the STI layer 14 and the photodiode 10 are poorer than those of the other interface 22 between the semiconductor substrate 15 and the gate oxide layer 17 negatively influences the photodiode. Hence, the leakage current of the former interface 20 can be more serious than that of the latter interface 22.

SUMMARY OF THE INVENTION

Accordingly, the present invention is directed to a CMOS image sensor and fabricating method thereof that may substantially obviate one or more disclosed or undisclosed problems or issues that may be due to limitations and disadvantages of the related art.

The present invention may provide a CMOS image sensor and fabricating method thereof, in which leakage current of a photodiode is reduced by configuring a triangular shaped photodiode area to minimize an interface contact with STI or annealing in the presence of deuterium to remove dangling bonds from an interface contacting with oxide.

Additional advantages, objects, and features of the invention will be set forth in part in the description which follows and in part will become apparent to those having ordinary skill in the art upon examination of the following. These and other advantages of the invention may be realized and attained by the structures and methods particularly pointed out in the written description and claims hereof as well as the appended drawings.

To achieve these and other advantages and in accordance with the invention, as embodied and broadly described herein, a CMOS image sensor according to an exemplary embodiment of the present invention includes a semiconductor substrate, a device isolation layer on the semiconductor substrate, and a plurality of photodiodes, each having a shape minimizing an area of a boundary contacting with the device isolation layer.

In one embodiment, each of a plurality of the photodiodes has a triangular shape.

The CMOS image sensor can further include a transistor area including transfer, reset drive and select transistors. The transistor area formed along a lateral side of the photodiode can have a triangular shape.

A plurality of the photodiodes can be alternately arranged so that each apex of the triangular photodiodes is alternately configured.

In another aspect of an exemplary embodiment of the present invention, a method of fabricating a CMOS image sensor includes the steps of forming a device isolation layer on a semiconductor substrate to define an active area, forming a photodiode on the semiconductor substrate in the active area, and annealing the semiconductor substrate in the presence of deuterium.

The annealing step can be carried out in the presence of deuterium with nitrogen.

A composition ratio of deuterium to nitrogen can be 2:8.

The annealing step can be carried out for 30 minutes at 400° C.

In a further aspect of an exemplary embodiment the present invention, a method of fabricating a CMOS image sensor includes the steps of forming a device isolation layer on a semiconductor substrate to define an active area, forming a photodiode on the semiconductor substrate in the active area to minimize an area of a boundary of the photodiode contacting the device isolation layer, and annealing the semiconductor substrate in the presence of deuterium.

The photodiode can be formed with a triangular shape.

The annealing step can be carried out in the presence of deuterium with nitrogen.

A composition ratio of deuterium to nitrogen can be 2:8.

The annealing step can be carried out for 30 minutes at 400° C.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention illustrate embodiments of the invention and, together with the description, serve to explain the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
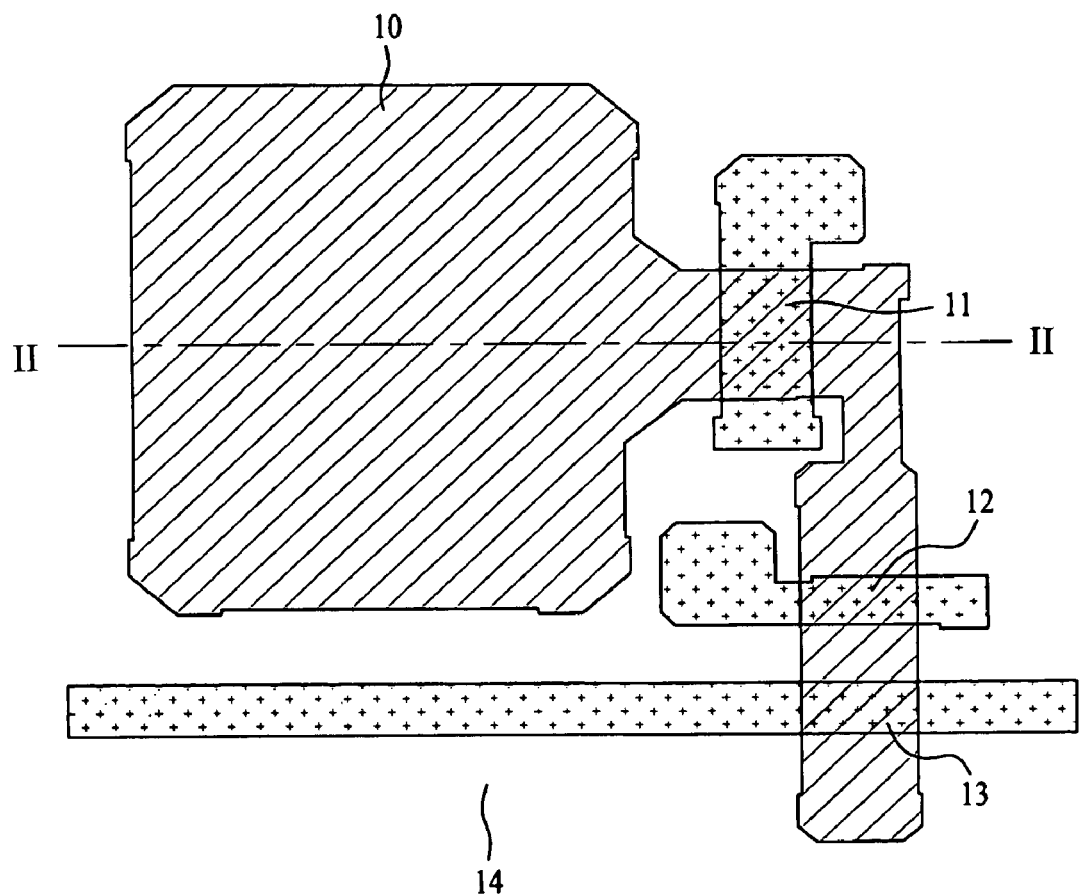
FIG. 1 is a layout of a unit pixel of a CMOS image sensor having three transistors and one photodiode according to a related art.
Figure 2:
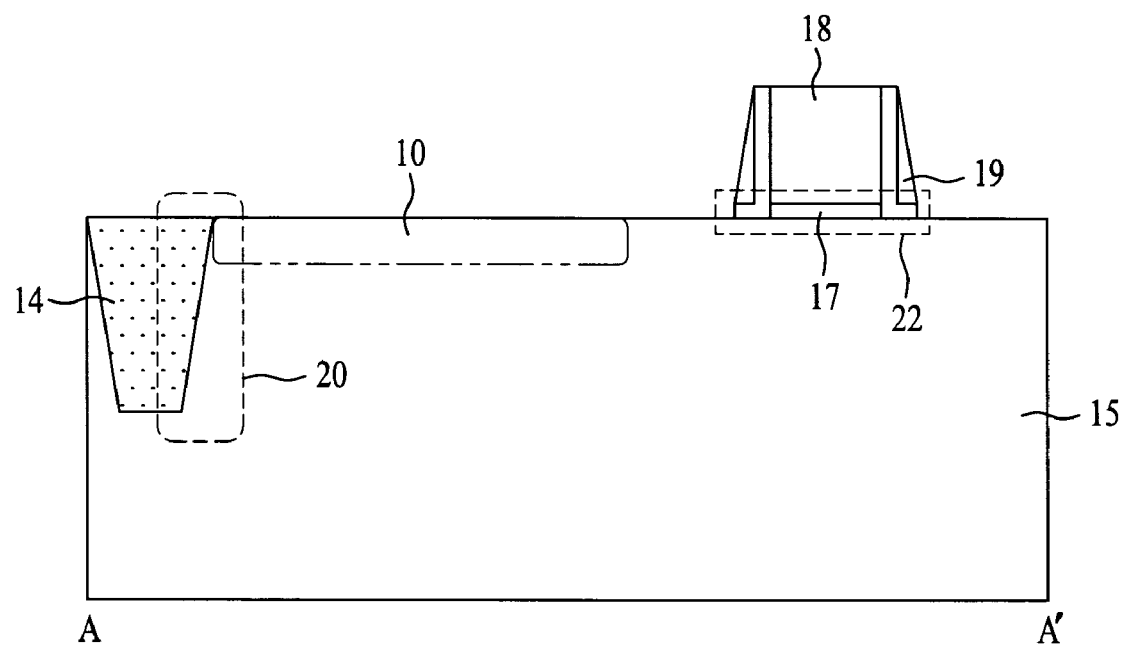
FIG. 2 is a cross-sectional diagram of the CMOS image sensor shown in FIG. 1 taken along line II-II.
Figure 3:
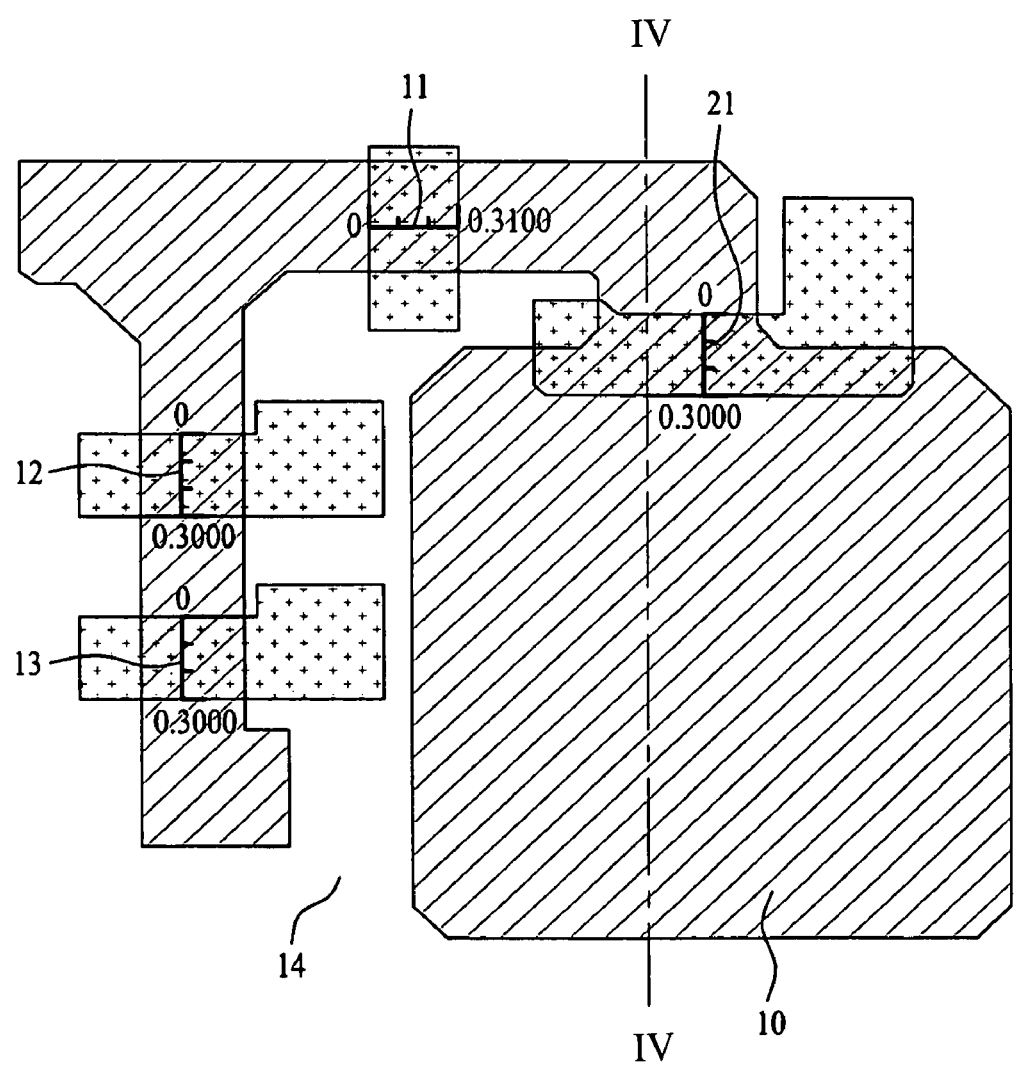
FIG. 3 is a layout of a unit pixel of a CMOS image sensor having four transistors and one photodiode according to a related art.
Figure 4:
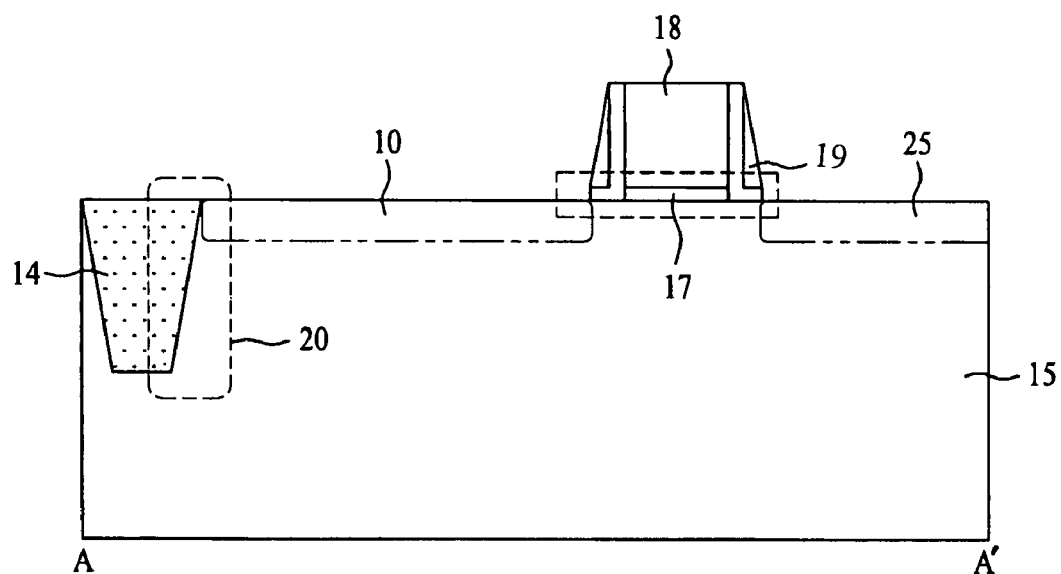
FIG. 4 is a cross-sectional diagram of the CMOS image sensor shown in FIG. 3 taken along cutting line IV-IV.
Figure 5:
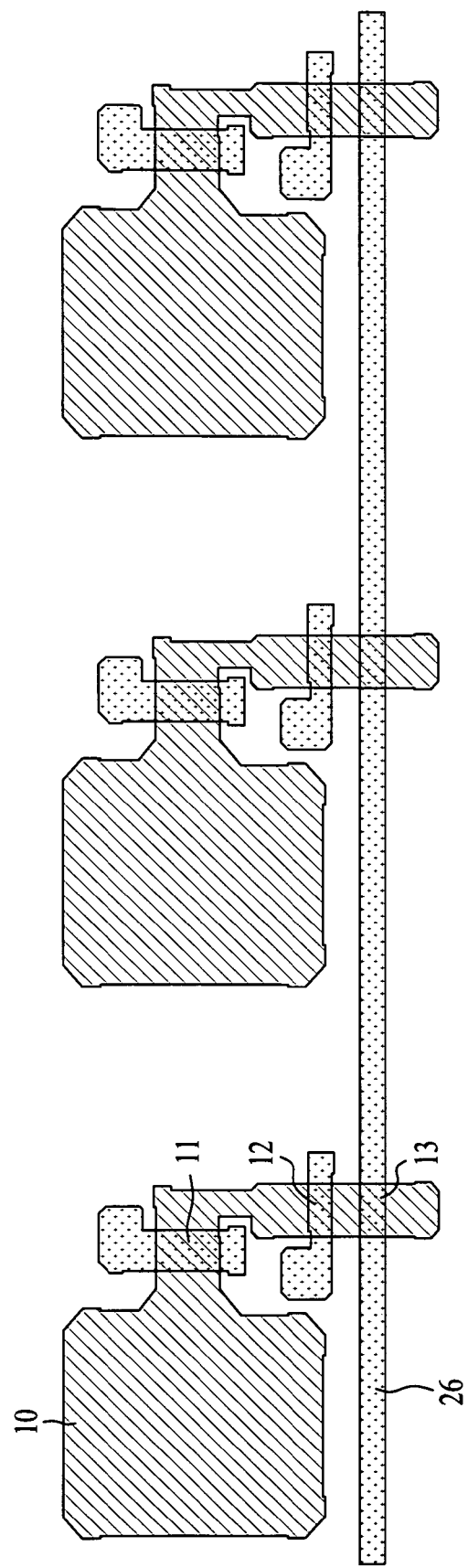
FIG. 5 and FIG. 6 are layouts of pixel arrays of the CMOS image sensors shown in FIG. 1 and FIG. 3, respectively.
Figure 6:
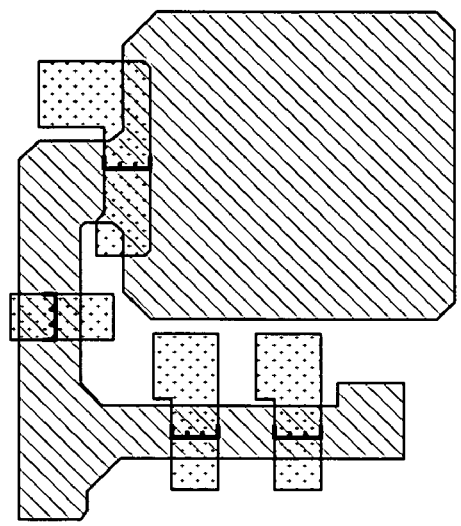
Figure 6:
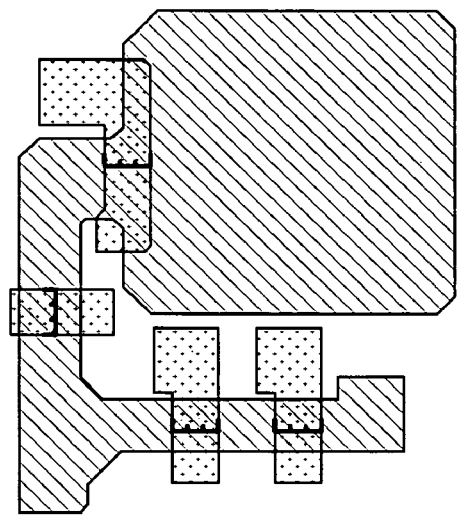
Figure 6:
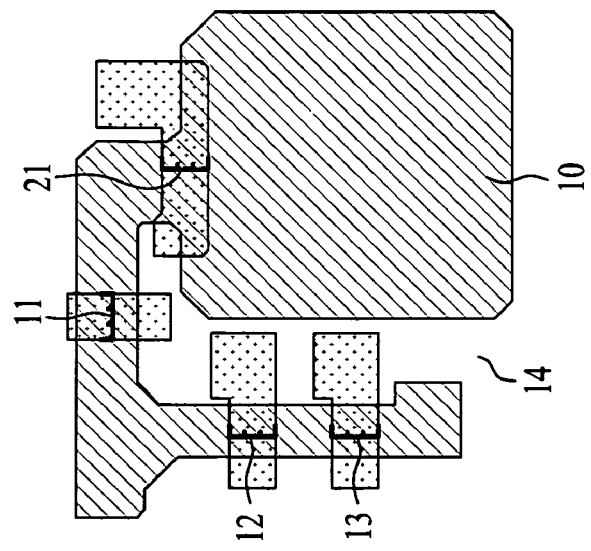
Figure 7:
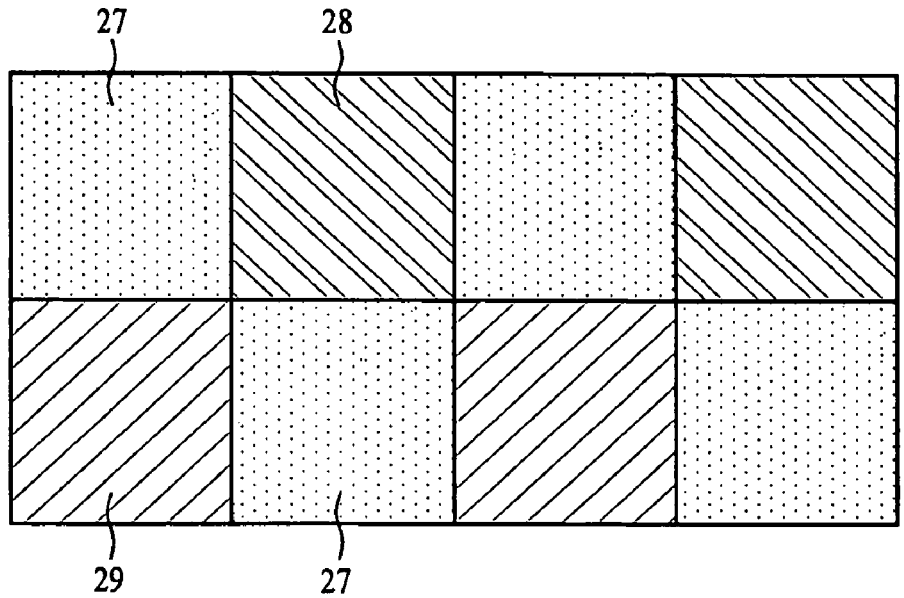
FIG. 7 is a diagram of a pixel array of a CMOS image sensor according to a related art.
Figure 8:
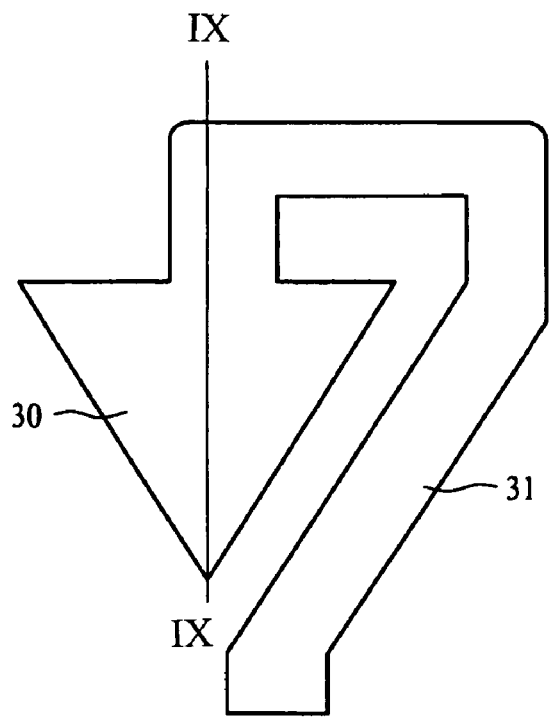
FIG. 8 is a layout of a photodiode according in a CMOS image sensor according to one embodiment of the present invention.

FIG. 8 is a layout of a photodiode in a CMOS image sensor according to one embodiment of the present invention. In the present embodiment, leakage current of a photodiode 30 is reduced by reducing an area that the photodiode 30 is in contact with an STI layer by changing the shape of the photodiode 30.

Referring to FIG. 8, a photodiode according to one embodiment of the present invention has triangular shape. An area of transfer 31, reset, drive and select transistors (not shown) can be arranged along a lateral side of the photodiode 30.

Figure 9:
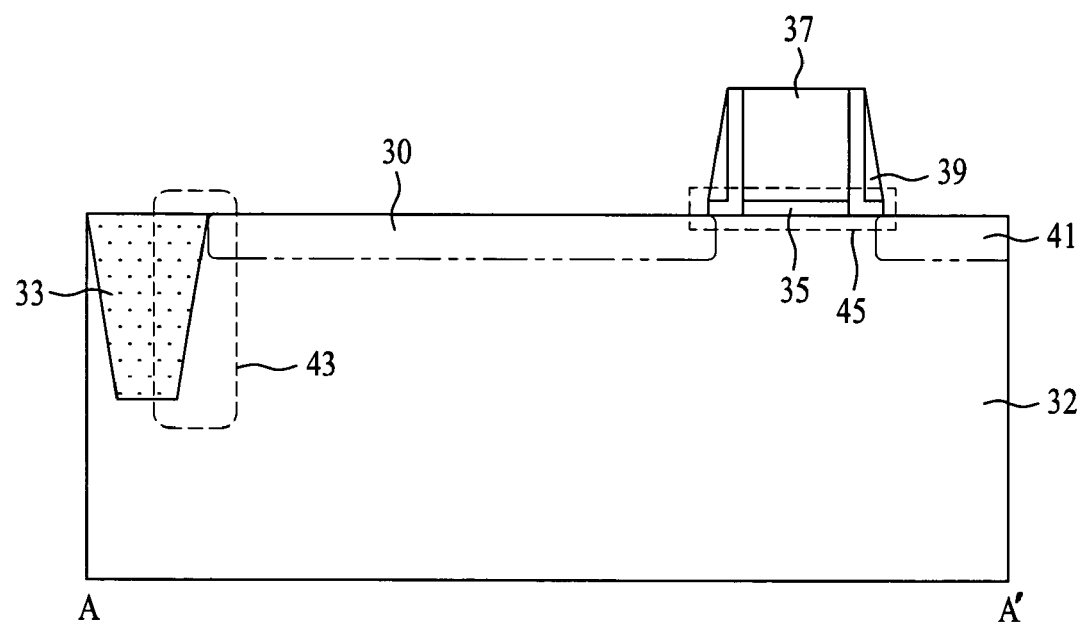
FIG. 9 is a cross-sectional diagram of the photodiode shown in FIG. 8 taken along line IX-IX.

FIG. 9 is a cross-sectional diagram of the photodiode shown in FIG. 8 taken along line IX-IX.

Referring to FIG. 9, a lightly-doped P type epitaxial layer (not shown) is grown on a heavily-doped P type substrate 32. A lightly-doped N type photodiode 30 is formed on the epitaxial layer. An STI layer 33 is formed to contact the photodiode 30. A gate oxide layer 35 and a gate electrode 37 of a transfer transistor are sequentially formed on the epitaxial layer. Spacers 39 are formed on both sidewalls of the gate electrode 37, respectively. A heavily-doped N type diffusion region 41 is formed on the epitaxial layer beside the gate electrode 37. An interface 43 is formed between the photodiode 30 and the STI layer 33. Another interface 45 is formed between the semiconductor substrate 32 and the gate oxide layer 35.

Figure 10:
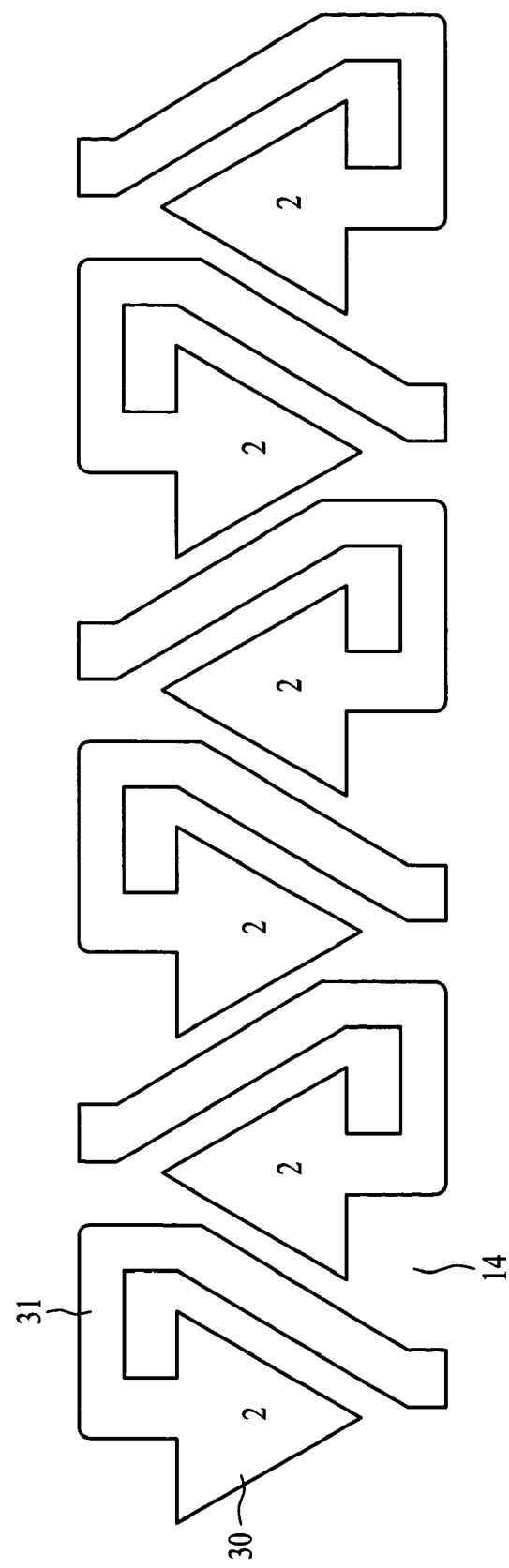
FIG. 10 is a layout of a pixel array of the CMOS image sensors having the photodiode shown in FIG. 8.

FIG. 10 is a layout of a pixel array of the CMOS image sensors having the photodiode shown in FIG. 8.

Referring to FIG. 10, a unit pixel of an image sensor includes one photodiode 30 and four transistors (not shown). The four transistors correspond to transfer, rest, drive and select transistors (not shown), respectively.

In particular, the photodiode 30 has a generally triangular shape. An area of the four transistors is located along a lateral side of the photodiode 30. A plurality of the triangular photodiodes 30 are alternately arranged so that each apex of the triangular photodiodes 30 alternates.

Figure 11:
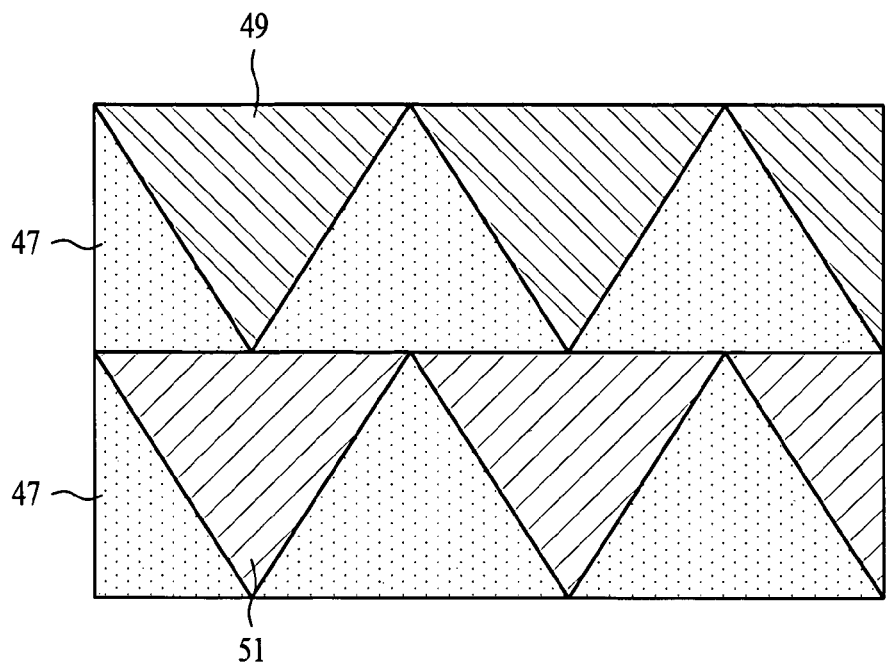
FIG. 11 is a diagram of a pixel array of a CMOS image sensor according to one embodiment of the present invention.

FIG. 11 is a diagram of a pixel array of a CMOS image sensor according to one embodiment of the present invention.

Referring to FIG. 11, in a first row, green and red pixels 47 and 49 are alternately arranged to be in contact with each other. In a second row, green and blue pixels 47 and 51 are alternately arranged to be in contact with each other.

In this embodiment, the leakage current is reduced by changing the shape of the photodiode 30. Alternatively, in another embodiment of the present invention, annealing is carried out in the presence of deuterium to remove dangling bonds from the interface 43 or 45 between the semiconductor substrate 32 and the oxide layer 33 or 35 after completion of the photodiode 30 and the STI layer 33. Accordingly, the leakage current of the photodiode 30 can be reduced.

Since hydrogen has a weight smaller than deuterium, a Si—H bond has a vibration frequency greater than that of Si-D bond. As vibration frequency of the Si-D bond is similar to a phonon frequency of Si, it is highly probable deuterium is bonded to Si better than hydrogen. Hence, deuterium annealing is more effective than hydrogen annealing for reducing leakage current.

The deuterium annealing is carried out for 30 minutes at 400° C. in 20% deuterium and 80% nitrogen.

Figure 12:
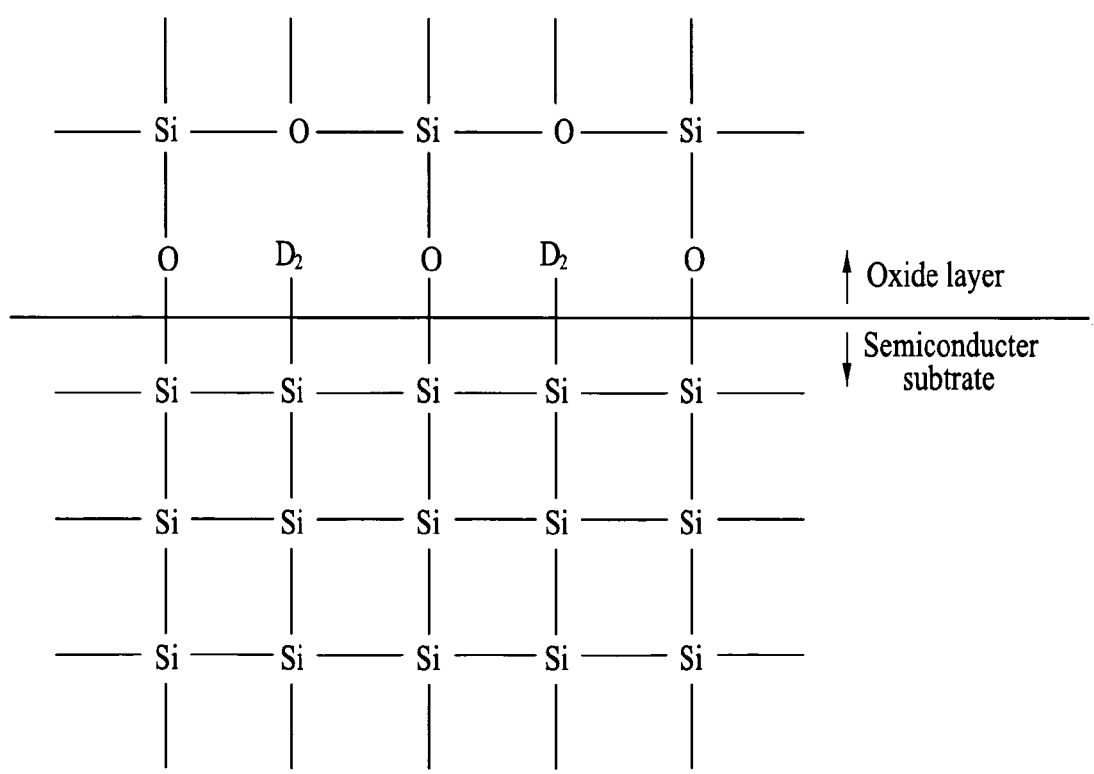
FIG. 12 is a diagram of an interface bonding state between a substrate and an oxide layer (STI or gate oxide layer) after completion of annealing in the presence of deuterium according to another embodiment of the present invention.

FIG. 12 is a diagram of a bonding state of an interface 43 or 45 between a semiconductor substrate 32 and an oxide layer (STI or gate oxide layer 33 or 35) after completion of deuterium annealing according to another embodiment of the present invention.

Referring to FIG. 12, once deuterium annealing is carried out, the dangling bonds existing in the interface 43 or 45 between the semiconductor substrate 32 and the oxide layer 33 or 35 are bonded to deuterium.

Figure 13:
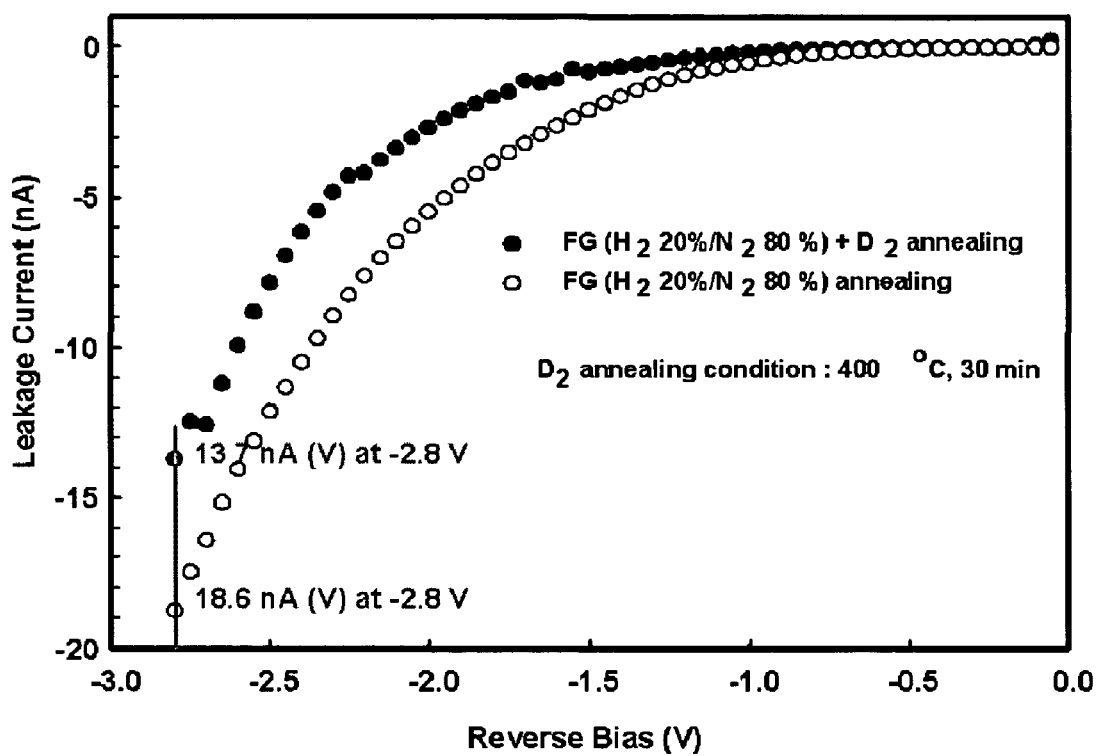
FIG. 13 is a comparison graph of leakage current characteristics of photodiodes annealed in the presence of deuterium and hydrogen according to another embodiment of the present invention and the related art, respectively.

FIG. 13 is a comparison graph of leakage current characteristics of photodiodes with deuterium ambience annealing and hydrogen annealing according to another embodiment of the present invention and the related art, respectively.

Referring to FIG. 13, leakage current characteristics of the present invention employing the annealing performed in 20% deuterium and 80% nitrogen are considerably better than those of the related art. In an exemplary embodiment, the annealing gas includes one of hydrogen and deuterium having a concentration of about 10 to 25%.

Figure 14:
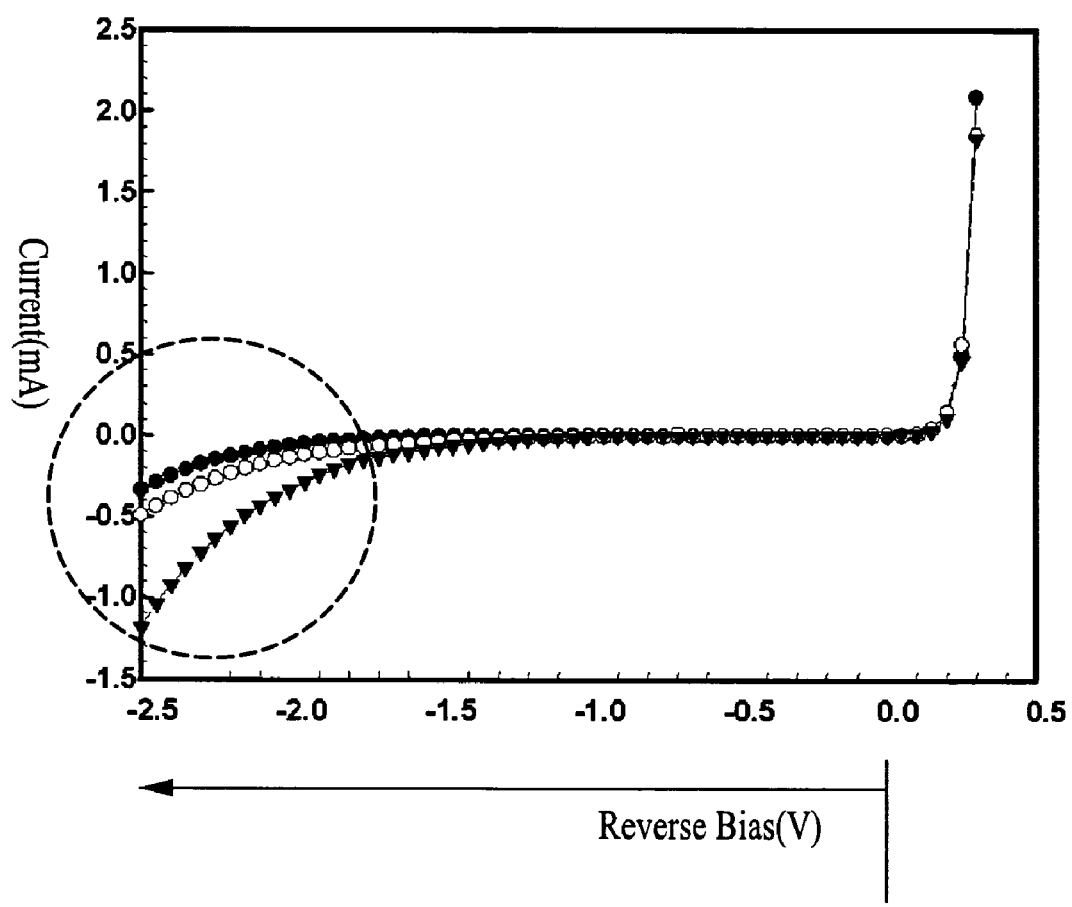
FIG. 14 is a comparison graph of current characteristics of photodiodes annealed by deuterium annealing and hydrogen annealing according to another embodiment of the present invention and the related art, respectively.

FIG. 14 is a comparison graph of current characteristics of photodiodes annealed by deuterium annealing and hydrogen annealing according to another embodiment of the present invention and the related art, respectively.

Referring to FIG. 14, passivation of the present invention with deuterium annealing is better than that of the related art having hydrogen annealing. Hence, the penetration of defects existing in the interface 43 is reduced toward the photodiode 30. Accordingly, leakage current is reduced.

Figure 15:
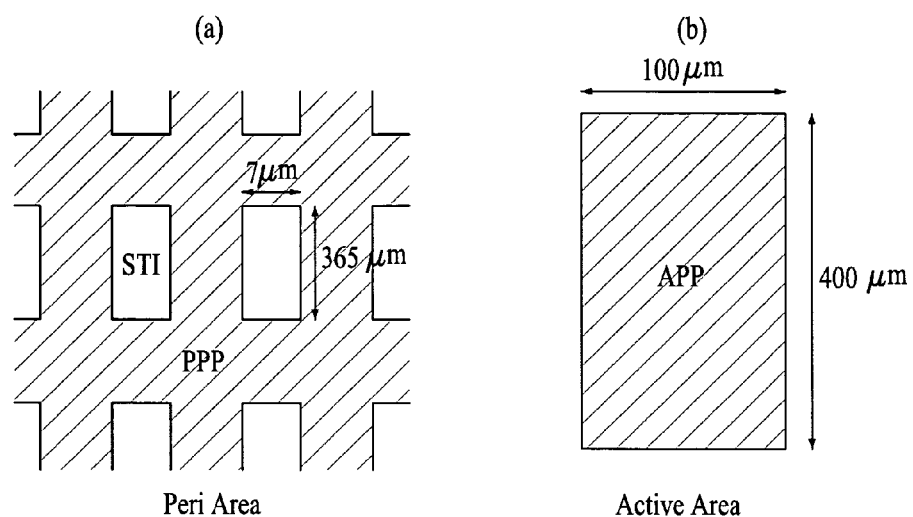
FIG. 15 is a diagram of photodiode patterns in peripheral and active areas, respectively.

FIG. 15 is a diagram of photodiode patterns in peripheral and active areas, respectively.

Figure 16:
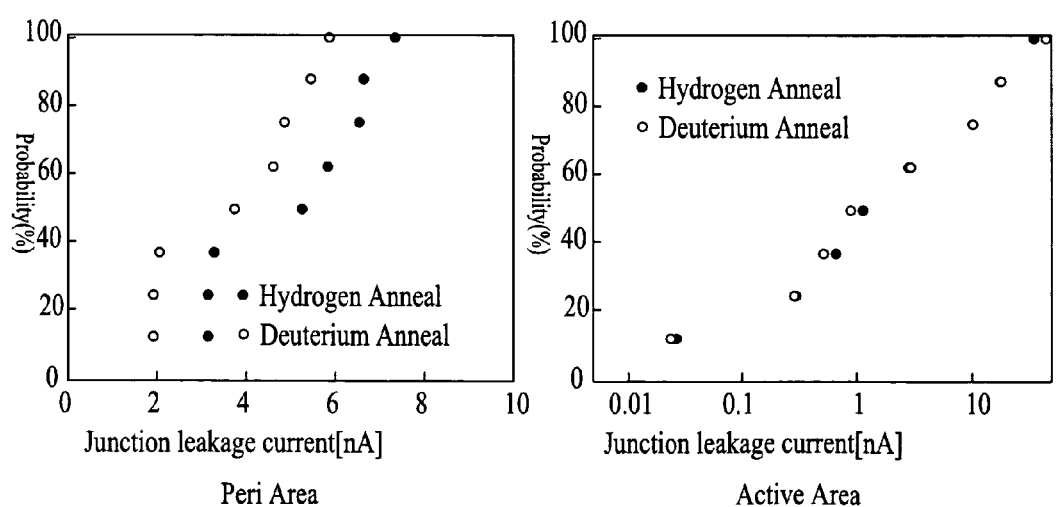
FIG. 16 shows graphs of leakage current reductions of photodiodes in active and peripheral areas by deuterium annealing according to another embodiment of the present invention, respectively.

A photodiode pattern PPP formed in a peri area to contact with STI layer in portion (a) of FIG. 15 is longer than a photodiode pattern APP formed in an active area shown in portion (b) of FIG. 15. In deuterium annealing, leakage current reduction by the photodiode pattern PPP in the peri area is greater than leakage current reducing effect by the photodiode pattern APP in the active area, which is shown in FIG. 16.

Figure 17:
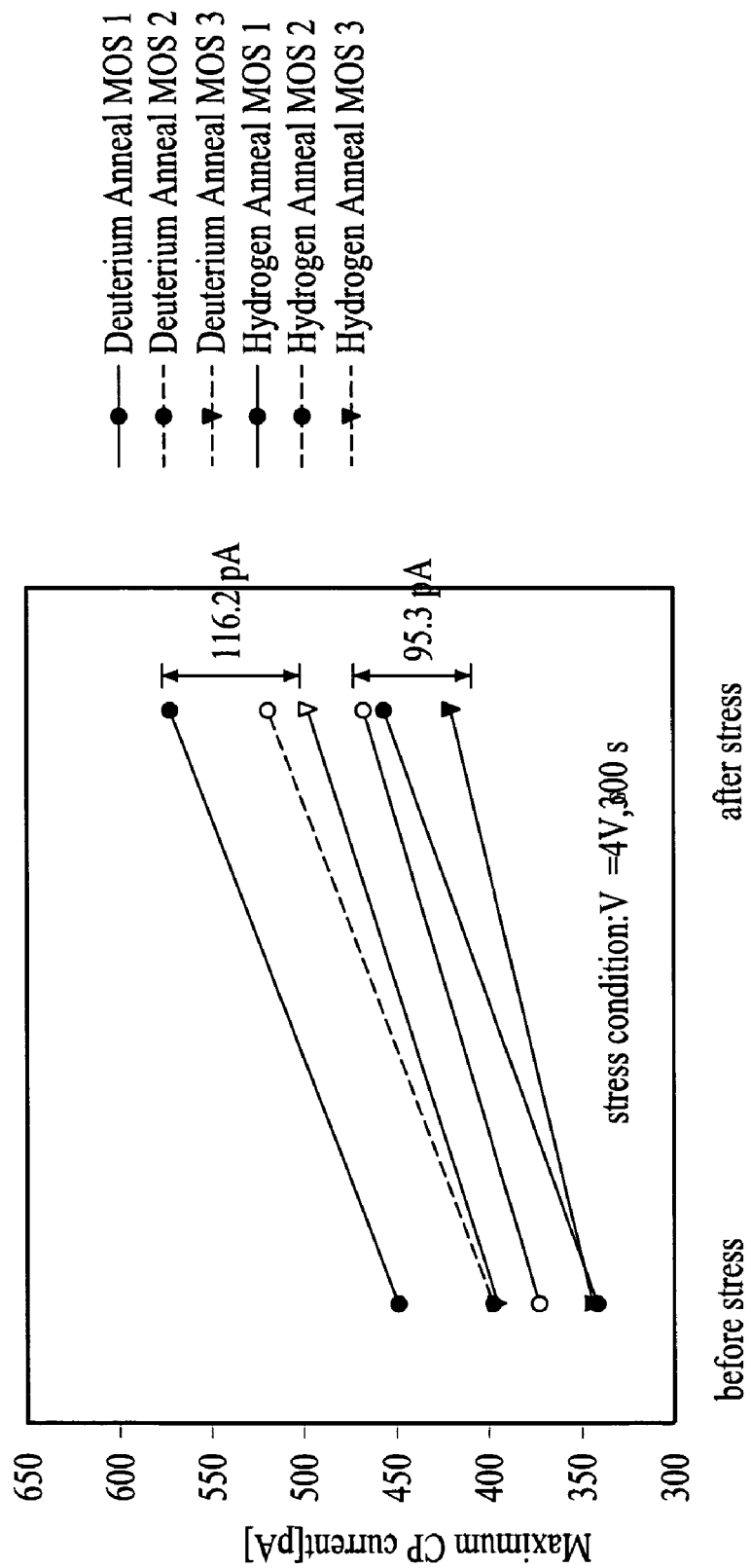
FIG. 17 is a comparison graph of interface characteristics according to stresses of MOS transistors annealed in the presence of deuterium and hydrogen according to another embodiment of the present invention and the related art, respectively.

FIG. 17 is a comparison graph of interface characteristics according to stresses of MOS transistors annealed in the preesnce deuterium and hydrogen according to another embodiment of the present invention and the related art, respectively.

Referring to FIG. 17, after impression of stress, a MOS transistor annealed in the presence of deuterium has a charge pumping (CP) current smaller than that of a MOS transistor annealed in the presence of hydrogen.

In the above-explained embodiments, the CMOS image sensor having the triangular shaped photodiode and the CMOS image sensor annealed in the presence of deuterium are provided. Alternatively, another image sensor can be fabricated using both of the triangular shaped photodiode and the deuterium annealing. In particular, after the triangular shaped photodiode has been formed on a semiconductor substrate, the semiconductor substrate is annealed in the presence of deuterium. Accordingly, the leakage current of the photodiode can be further reduced.

Accordingly, the present invention may provide the following effects or advantages.

The interface between the STI and the photodiode is minimized by the triangular spahed photodiode to prevent the defects existing in the STI interface from penetrating the photodiode, whereby the leakage current of the photodiode can be reduced.

The image sensor of the present invention can accommodate twice the pixels as compared to the related art image sensor employing the rectangular shaped photodiode, thereby enhancing the degree of integration.

The annealing is carried out in the presence of deuterium to enhance reliability against electric stress as well as to secure effective curing of the damage caused by PPID (plasma process induced damage).

As deuterium is bonded to the dangling bonds at the interface, the corresponding interface characteristics are enhanced to reduce the leakage current. Since deuterium is heavier than hydrogen, deuterium is less separated by stress from the dangling bond of Si than hydrogen. Hence, the interface characteristics are enhanced to further reduce the leakage current.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a CMOS image sensor, comprising:

forming a shallow trench isolation layer on a semiconductor substrate to define an active area and peri area;

forming a photodiode on the semiconductor substrate in the active area and peri area, wherein a length of the photodiode formed in the active area to contact with the shallow trench isolation layer is shorter than a length of a photodiode formed in the peri area to contact with the shallow trench isolation layer; and annealing the semiconductor substrate in the presence of deuterium, to remove dangling bonds from an interface between the semiconductor substrate and the shallow trench isolation layer.

2. The method of claim 1, wherein the annealing step is carried out in the presence of nitrogen.

3. The method of claim 2, wherein a composition ratio of deuterium to nitrogen is 2:8.

4. The method of claim 2, wherein the deuterium having a concentration of about 10 to 25%.

5. The method of claim 1, wherein the annealing step is carried out for 30 minutes at 400° C.

6. The method of claim 1, wherein the photodiode has a triangular shape.

* * * * *